(12) United States Patent
Kang et al.

(10) Patent No.: US 11,763,856 B2
(45) Date of Patent: Sep. 19, 2023

(54) 3-D DRAM STRUCTURE WITH VERTICAL BIT-LINE

(71) Applicant: Applied Materials, Inc., Santa Clara, CA (US)

(72) Inventors: Sung-Kwan Kang, San Jose, CA (US); Gill Yong Lee, San Jose, CA (US); Chang Seok Kang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 186 days.

(21) Appl. No.: 17/323,165

(22) Filed: May 18, 2021

(65) Prior Publication Data

US 2021/0272604 A1 Sep. 2, 2021

Related U.S. Application Data

(62) Division of application No. 16/718,372, filed on Dec. 18, 2019, now abandoned.

(60) Provisional application No. 62/783,543, filed on Dec. 21, 2018.

(51) Int. Cl.
*G11C 5/06* (2006.01)
*H10B 12/00* (2023.01)

(52) U.S. Cl.
CPC ............. *G11C 5/063* (2013.01); *H10B 12/03* (2023.02); *H10B 12/30* (2023.02); *H10B 12/482* (2023.02); *H10B 12/488* (2023.02)

(58) Field of Classification Search
CPC ........... G11C 5/063; G11C 5/025; G11C 7/18; G11C 8/14; H01L 27/10805; H01L 27/1085; H01L 27/10885; H01L 27/10891
See application file for complete search history.

(56) References Cited

U.S. PATENT DOCUMENTS

| | | | |
|---|---|---|---|
| 2008/0102578 A1* | 5/2008 | Schlosser | H01L 27/10894 438/243 |
| 2014/0085959 A1 | 3/2014 | Saraswat et al. | |
| 2017/0018301 A1 | 1/2017 | Kilmer et al. | |
| 2018/0323199 A1* | 11/2018 | Roberts | H01L 27/10882 |
| 2018/0331073 A1 | 11/2018 | Sekar et al. | |

* cited by examiner

*Primary Examiner* — Mohammed R Alam
(74) *Attorney, Agent, or Firm* — Servilla Whitney LLC

(57) ABSTRACT

Memory devices are described. The memory devices include a plurality of bit lines extending through a stack of alternating memory layers and dielectric layers. Each of the memory layers include a first word line, a second word line, a first capacitor, and a second capacitor. Methods of forming stacked memory devices are also described.

18 Claims, 10 Drawing Sheets

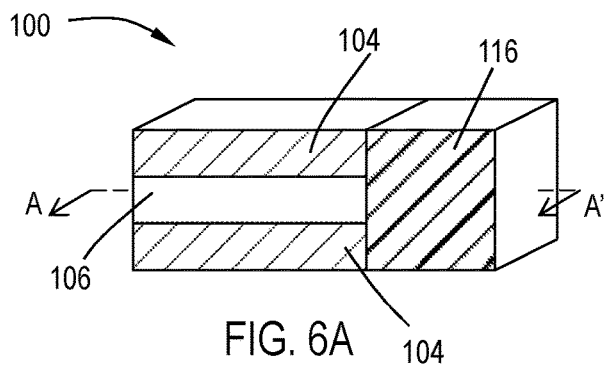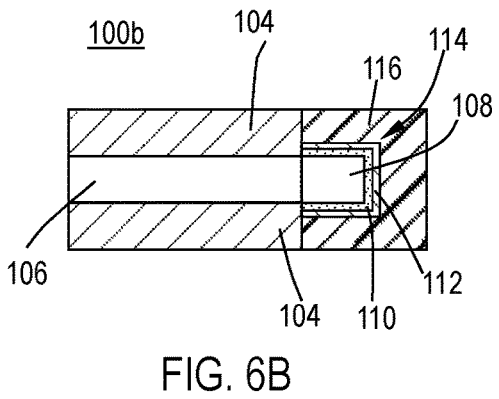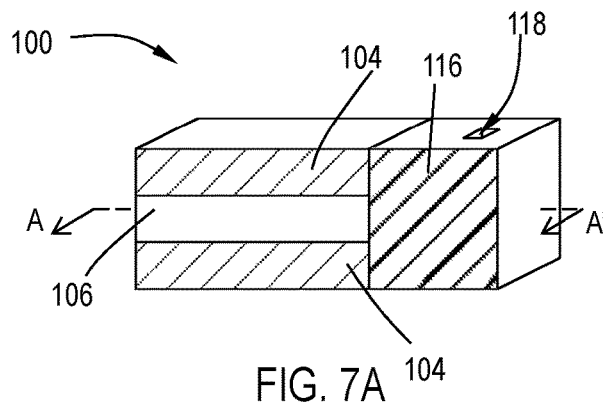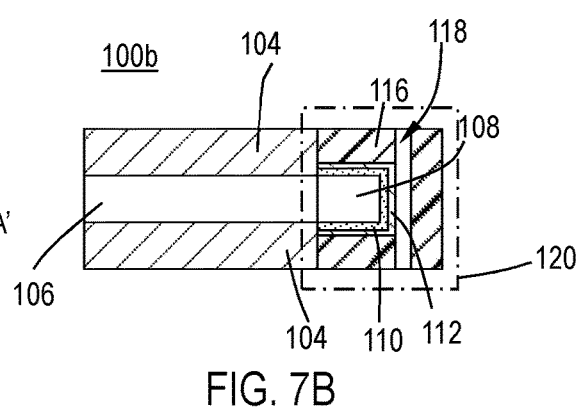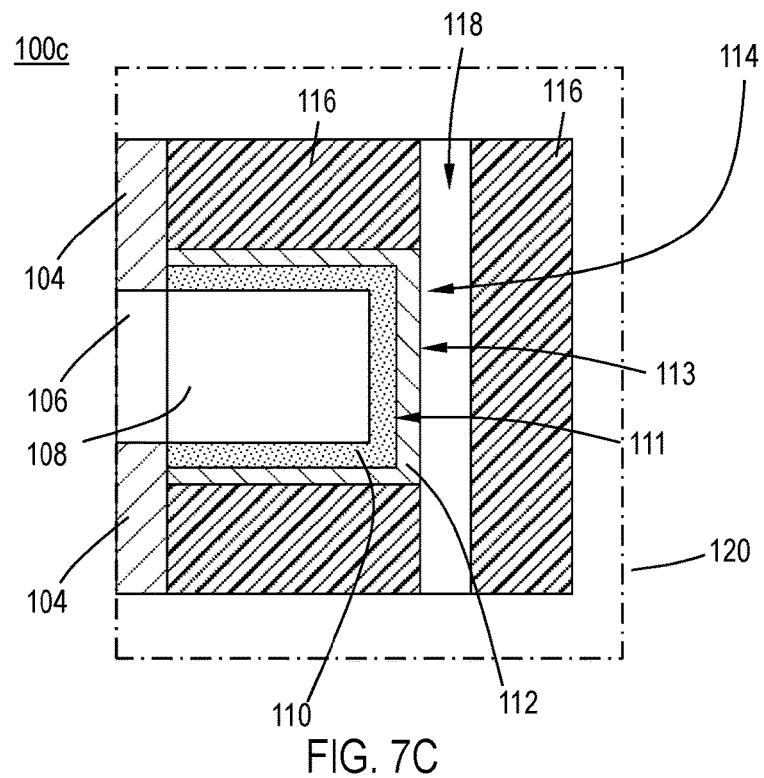

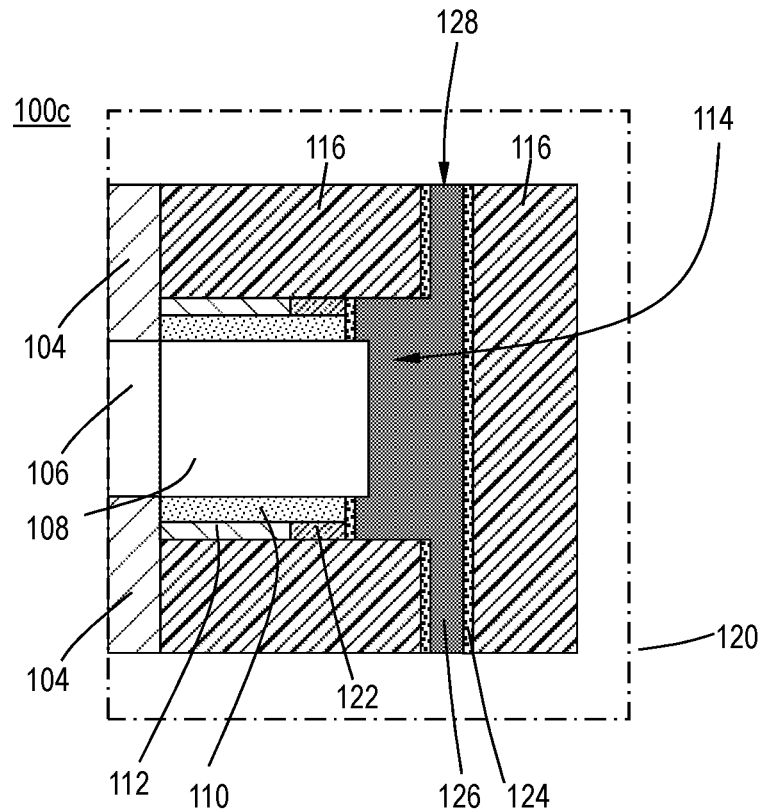
FIG. 12
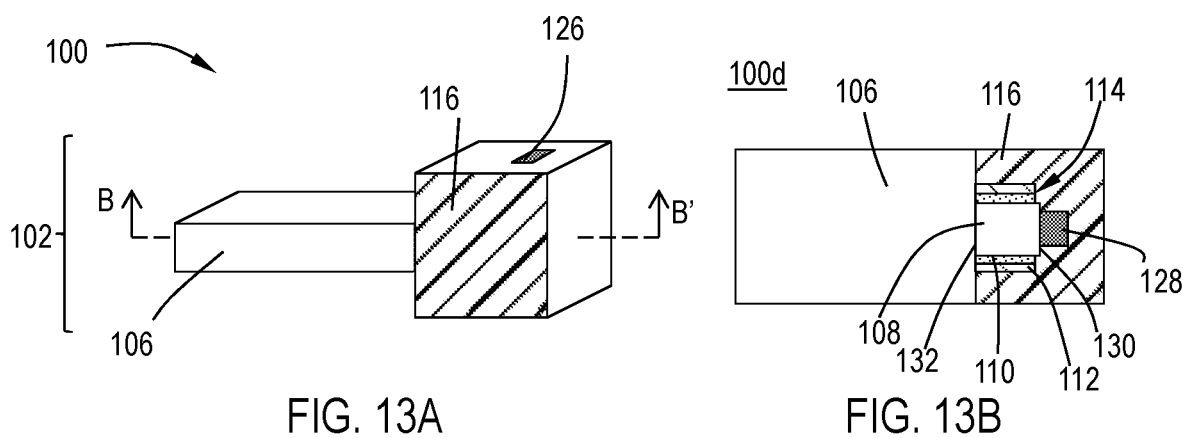
FIG. 13A
FIG. 13B

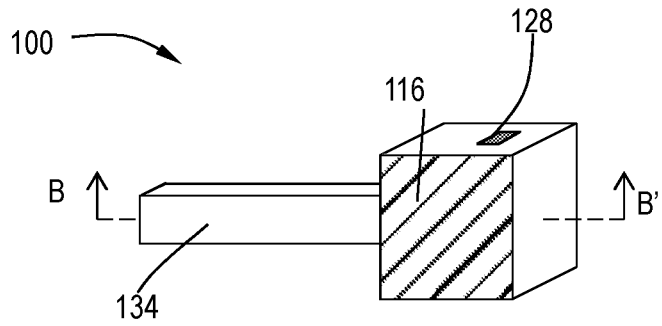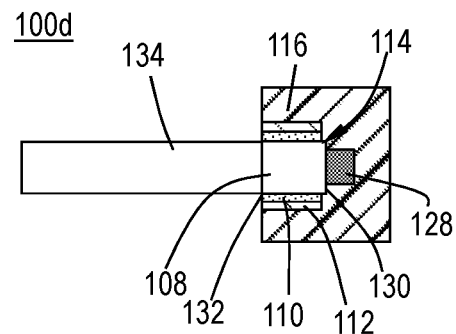
FIG. 14A  FIG. 14B
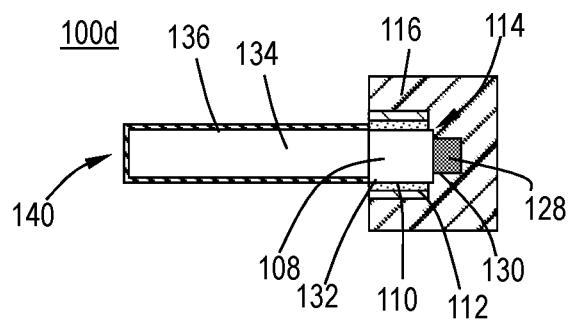
FIG. 15
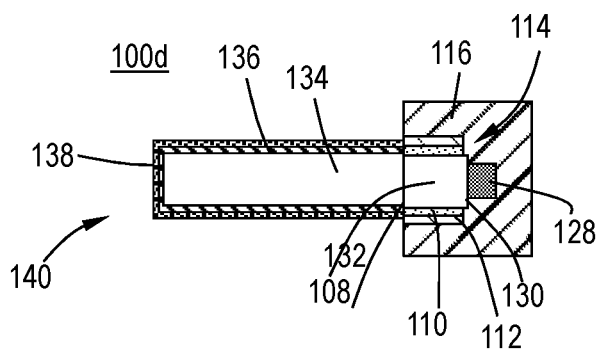
FIG. 16

3-D DRAM STRUCTURE WITH VERTICAL BIT-LINE

CROSS-REFERENCE TO RELATED APPLICATIONS

This application is a divisional application of U.S. application Ser. No. 16/718,372, filed on Dec. 18, 2019, which claims priority to U.S. Provisional Application No. 62/783,543, filed Dec. 21, 2018, the entire disclosures of which are hereby incorporated by reference herein.

TECHNICAL FIELD

Embodiments of the present disclosure pertain to the field of electronic devices and electronic device manufacturing. More particularly, embodiments of the disclosure provide dynamic random-access memory with increased bit-density.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices.

DRAM cells and circuits may be produced using semiconductor lithography. Modern trends in DRAM production include scaling DRAMs to ever smaller lithography sizes. As sizes are reduced, it becomes more difficult to maintain reliability and performance as lithography error rates increase. Thus, there is a need for DRAMs that are scalable while maintaining reliability and performance.

SUMMARY

Embodiments of the disclosure are directed to memory devices and methods of forming memory devices. In one or more embodiments, a memory device comprises a plurality of bit lines extending through a stack of alternating memory layers and dielectric layers, each of the memory layers comprising a first word line having a first side adjacent a first side of the plurality of bit lines and a second side opposite the first side, a second word line having a first side adjacent a second side of the plurality of bit lines and a second side opposite the first side, and at least one first capacitor adjacent the second side of the first word line, and at least one second capacitor adjacent the second side of the second word line.

In one or more embodiments, a method of forming a memory device comprises providing a stack of alternating dielectric layers and memory layers with at least one bit line extending through the alternating dielectric layers and memory layers, each of the memory layers having at least one word line with a first side adjacent the bit line and a second side opposite the first side; forming at least one pre-capacitor extension in the memory layer, the pre-capacitor extension in contact with the second side of the word line; and forming a capacitor on the pre-capacitor extension.

In one or more embodiments, a method of forming a memory device comprises providing a stack of alternating dielectric layers and memory layers, each of the memory layers having a plurality pre-word line extensions; forming a first word line with a first side and a second side opposite the first side, by depositing a first word line metal on the plurality of pre-word line extensions to electrically connect the plurality of pre-word line extensions; patterning the alternating dielectric layers and memory layers to form a plurality of bit line openings, each bit line opening extending through the alternating dielectric layers and memory layers; depositing a bit line metal in the plurality of bit line openings to form a plurality of bit lines, each bit line having a first side and a second side opposite the first side, the first side adjacent the first side of the first word line; selectively removing a portion of the memory layer on the second side of the first word line adjacent the first side of the plurality of bit lines to form at least one first pre-capacitor extension; and depositing one or more of a high-K dielectric material or a metal layer on the first pre-capacitor extension to form a first capacitor.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 6A illustrates a cross-section view of a memory device according to one or more embodiments;

FIG. 6B illustrates a cross-section view of the memory device of FIG. 6A according to one or more embodiments;

FIG. 7A illustrates a cross-section view of a memory device according to one or more embodiments;

FIG. 7B illustrates a cross-section view of the memory device of FIG. 7A according to one or more embodiments;

FIG. 7C illustrates an expanded cross-section view of the memory device of FIG. 7B according to one or more embodiments;

FIG. 12 illustrates an expanded cross-section view of a memory device according to one or more embodiments;

FIG. 13A illustrates a cross-section view of a memory device according to one or more embodiments;

FIG. 13B illustrates a cross-section view of the memory device of FIG. 13A according to one or more embodiments;

FIG. 14A illustrates a cross-section view of a memory device according to one or more embodiments;

FIG. 14B illustrates a cross-section view of the memory device of FIG. 14A according to one or more embodiments;

FIG. 15 illustrates a cross-section view of a memory device according to one or more embodiments;

FIG. 16 illustrates a cross-section view of a memory device according to one or more embodiments;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

Figure 1:
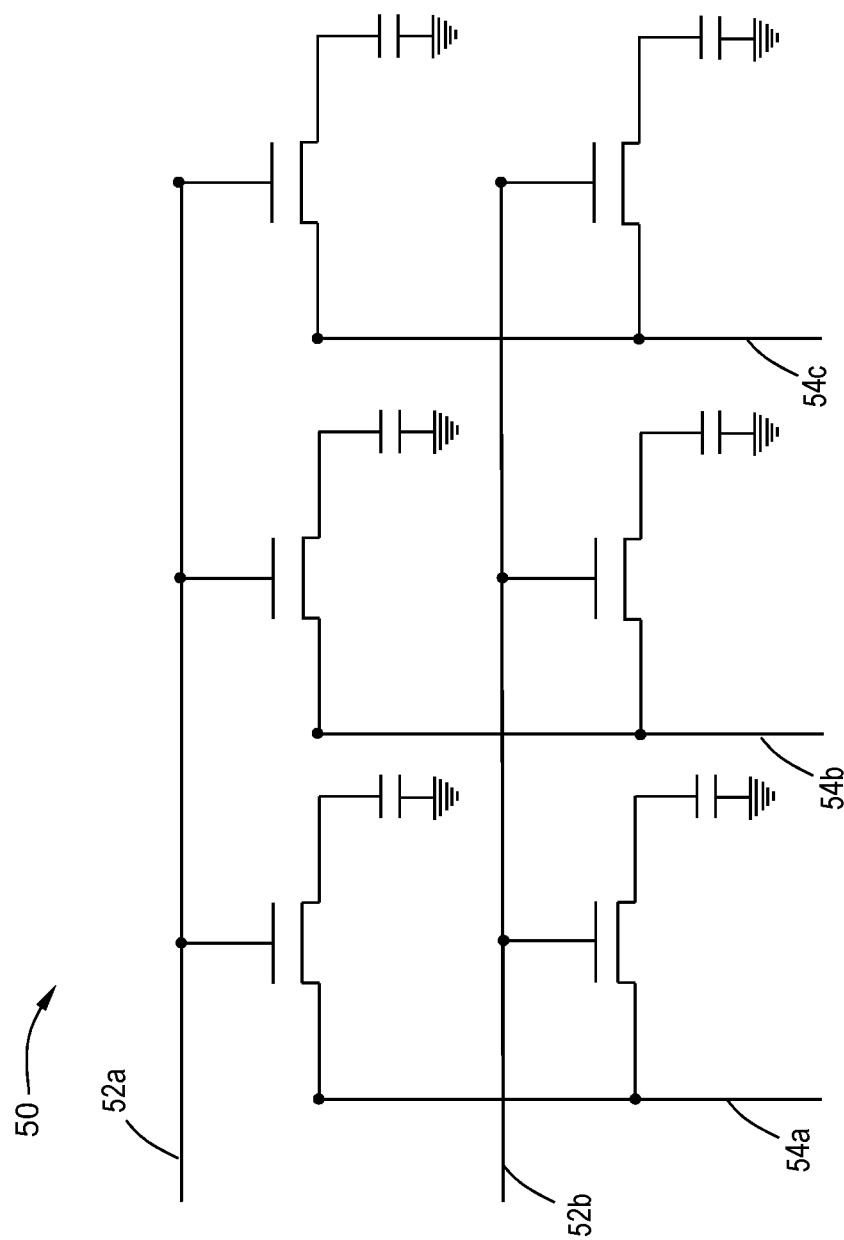
FIG. 1 illustrates a circuit diagram of a DRAM cell block in accordance with the prior art.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. The DRAM device, as illustrated in FIG. 1, is formed of an array of DRAM cells. The rows on access transistors are linked by word lines 52a, 52b, and the transistor inputs/outputs are linked by bitlines 54a, 54b, 54c. Historically, DRAM capacitors have evolved from planar polysilicon-oxide-substrate plate capacitors to 3-D structures which have diverged into "stack" capacitors with both plates above the substrate, and "trench" capacitors using an etched cavity in the substrate as the common plate.

Traditionally, DRAM cells have recessed high work-function metal structures in buried word line structure. In a DRAM device, a bitline is formed in a metal level situated above the substrate, while the word line is formed at the polysilicon gate level at the surface of the substrate. In the buried word line (bWL) a word line is buried below the surface of a semiconductor substrate using a metal as a gate electrode.

In one or more embodiments, memory devices are provided which have stacked DRAM cells, resulting in an increase in DRAM cell bit-density, which is proportional to the number of multi-pair films. The DRAM device of one or more embodiments has vertical bitlines, minimizing bitline capacitance and reducing the burden of capacitor capacitance.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

Figure 2:
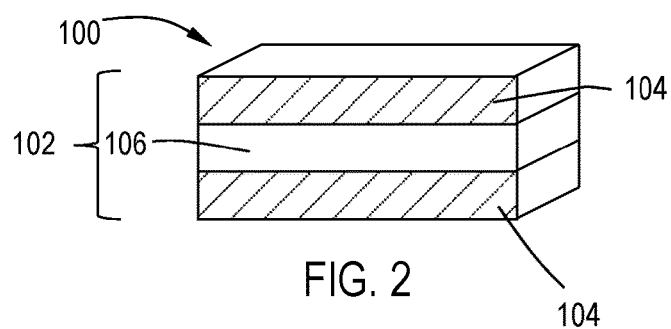
FIG. 2 illustrates a cross-section view of a memory device according to one or more embodiments.

FIGS. 2 through 23 are cross-sectional views illustrating a memory device 100 according to one or more embodiments. Referring to FIG. 2, a memory device 100 is formed from a stack 102 of alternating dielectric layers 104 and memory layers 106. In one or more embodiments there are at least two dielectric layers 104. In one or more embodiments there are at least two memory layers 106. In other embodiments, there are from 2 to 100 dielectric layers 104 and from 2 to 100 memory layers 106. Typically, there is one more dielectric layer 104 than memory layers 106 so that the stack 102 is bounded on top and bottom by a dielectric layer 104. As recognized by one of skill in the art, while only 2 dielectric layers 104 and one memory layer 106 are depicted, a stack 102 can comprise any number of alternating dielectric layers 104 and memory layers 106.

As used herein, the term "dielectric layer" refers to a layer of material that is an electrical insulator that can be polarized in an electric field. In one or more embodiments, the dielectric layer comprises one or more of oxides, carbon doped oxides, silicon oxide (SiO), porous silicon dioxide (SiO$_2$), silicon oxide (SiO), silicon nitride (SiN), silicon oxide/silicone nitride, carbides, oxycarbides, nitrides, oxynitrides, oxycarbonitrides, polymers, phosphosilicate glass, fluorosilicate (SiOF) glass, or organosilicate glass (SiOCH).

As used herein, the term "memory layer" refers to a layer of material in which a word line can be made. In one or more embodiments, the memory layer comprises one or more of silicon or doped silicon. For example, in one or more embodiments, the memory layer is selected from one or more of Si, or IGZO (In—Ga—Zn Oxide). In some embodiments, the dielectric layer comprises a material that is etch selective relative to the memory layer.

Figures 3A, 3B:
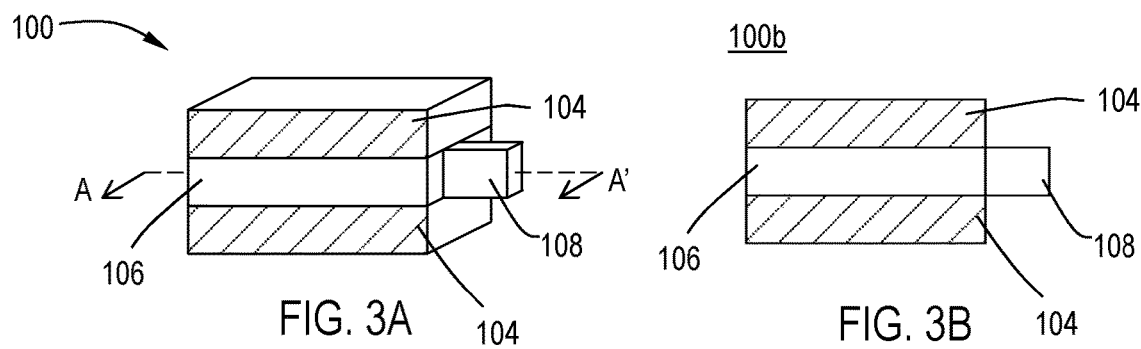
FIG. 3A illustrates a cross-section view of a memory device according to one or more embodiments.
FIG. 3B illustrates a cross-section view of the memory device of FIG. 3A according to one or more embodiments.

With reference to FIGS. 3A and 3B, the memory device 100 is etched through the stack to form a pre-word line extension 108 on at least some of, or each of the memory layers 106. In some embodiments, at least some of, or each of the memory layer 106 has a plurality of pre-word line extensions 108. As recognized by one of skill in the art, there may be a multitude of pre-word line extensions 108 in each memory layer 106, but, for ease of drawing, only a single pre-word line extension 108 is illustrated. FIG. 3B is a cross-section view 100b taken along axis A-A' of FIG. 3A. In one or more embodiments, the plurality of pre-word line extensions 108 are formed by etching at least one channel through the stack 102 of alternating dielectric layers 104 and memory layers 106, and selectively removing the dielectric layers 104.

In some embodiments, the at least one channel is etched through an opening in a mask (not illustrated) formed on the stack 102 followed by an anisotropic etch process.

Figures 4A, 4B:
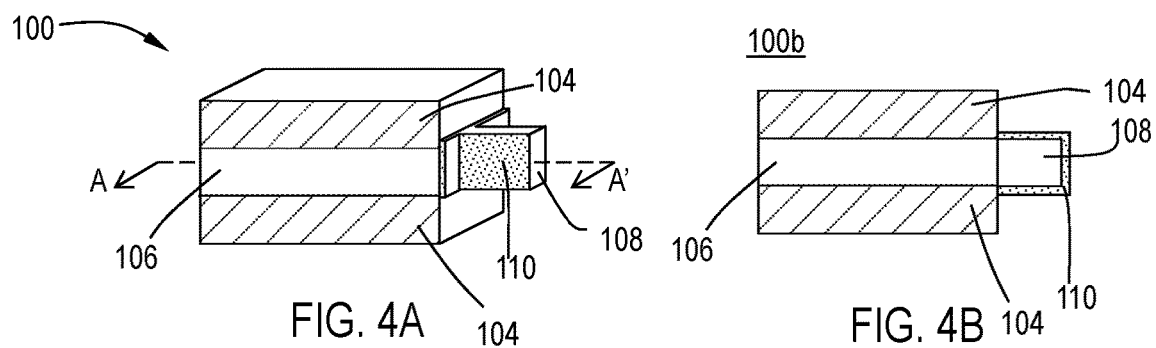
FIG. 4A illustrates a cross-section view of a memory device according to one or more embodiments.
FIG. 4B illustrates a cross-section view of the memory device of FIG. 4A according to one or more embodiments.

With reference to FIGS. 4A and 4B, a gate oxide layer 110 is formed on the pre-word line extension 108. FIG. 4B is a cross-section view 100b taken along axis A-A' of FIG. 4A. The illustrated embodiment shows the gate oxide layer 110 as a conformal layer with a uniform shape. However, the skilled artisan will recognize that this is merely for illustrative purposes and that the gate oxide layer 110 can form in an isotropic manner so that the gate oxide layer 110 has a rounded appearance.

In one or more embodiments, the gate oxide layer 110 comprises a gate oxide material. In one or more embodiments, the gate oxide layer 110 comprises one or more of silicon oxynitride (SiON), silicon oxide, or a high-K dielectric material. While the term "silicon oxide" may be used to describe the gate oxide layer 110, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, tungsten oxide, zirconium oxide, aluminum oxide, hafnium oxide, and the like.

Figures 5A, 5B:
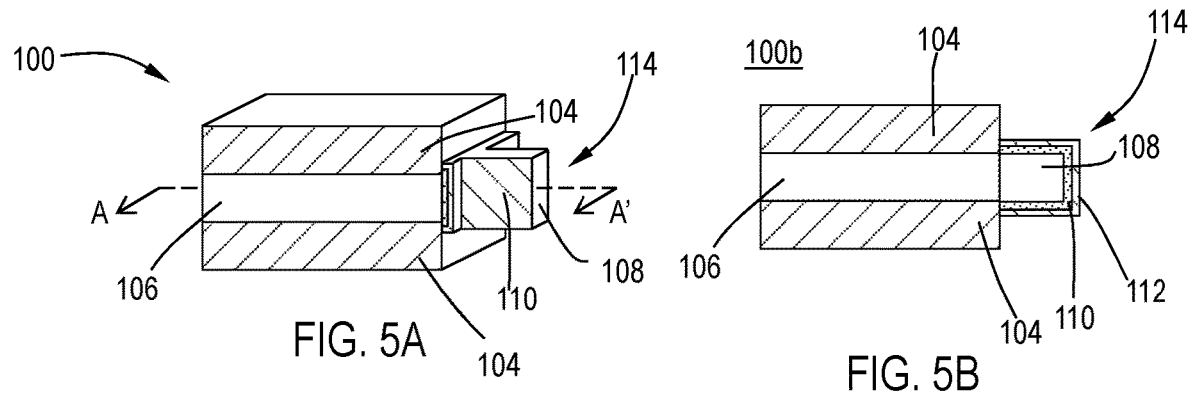
FIG. 5A illustrates a cross-section view of a memory device according to one or more embodiments.
FIG. 5B illustrates a cross-section view of the memory device of FIG. 5A according to one or more embodiments.

Referring to FIGS. 5A and 5B, a word line 114 is formed by depositing a word line metal 112 on the plurality of pre-word line extensions 108 and gate oxide layers 110. FIG. 5B is a cross-section view 100b taken along axis A-A' of FIG. 5A. The illustrated embodiment shows the word line metal 112 as a conformal layer with uniform shape. However, the skilled artisan will recognize that this is merely for illustrative purposes and that the gate oxide layer 110 can form in an isotropic manner so that the gate oxide layer 110 has a rounded appearance When the word line metal 112 is deposited on the plurality of pre-word line extensions 108, the pre-word line extensions 108 are electrically connected. In one or more embodiments, the word line metal 112 is deposited on the gate oxide layer 110. In one or more embodiments, the word line metal 112 comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). The word line metal 112 is deposited using any one of a number of methods known to one of skill in the art, including, but not limited to, chemical vapor deposition, physical vapor deposition, or atomic layer deposition.

In one or more embodiments, forming the word line 114 further comprises forming a bit line metal seed layer on the oxide layer 110 prior to depositing a bit line metal.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

Referring to FIGS. 6A and 6B, a dielectric material 116 is then deposited on (surrounding) the word line 114. FIG. 6B is a cross-section view 100b taken along axis A-A' of FIG. 6A. The dielectric material 116 is deposited using any one of a number of methods known to one of skill in the art, including, but not limited to, chemical vapor deposition, physical vapor deposition, or atomic layer deposition. The dielectric material 116 can be the same composition as the dielectric layers 104 or a different composition.

Referring to FIGS. 7A-7C, the alternating dielectric layers 104 and memory layers 106 with a plurality of word lines 114 are then patterned to form a plurality of bit line openings 118. In one or more embodiments, each bit line opening 118 extends through the alternating dielectric layers 104 and memory layers 106. FIG. 7B is a cross-section view 100b taken along axis A-A' of FIG. 7A. FIG. 7C is an expanded view 100c of the area/square 120 in FIG. 7B.

Figure 8:
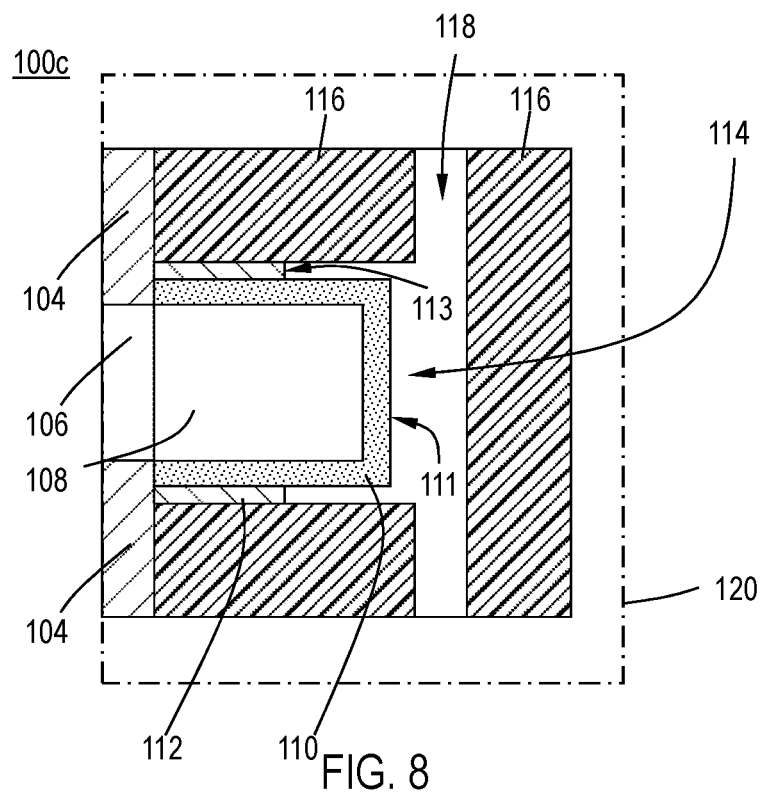
FIG. 8 illustrates an expanded cross-section view of a memory device according to one or more embodiments.

Referring to FIG. 8, which is an expanded view 100c of the area/square 120 in FIG. 7B, the word line metal 112 is recessed. Recessing of the word line metal 112 can be done by any suitable technique known to the skilled artisan. Recessing the word line metal 112 causes the top surface 113 of the word line metal 112 to be lower than the top surface 111 of the gate oxide layer 110. Recessing the word line metal 112 exposes the top surface 111 of the gate oxide layer 110 to the bit line opening 118.

Figure 9:
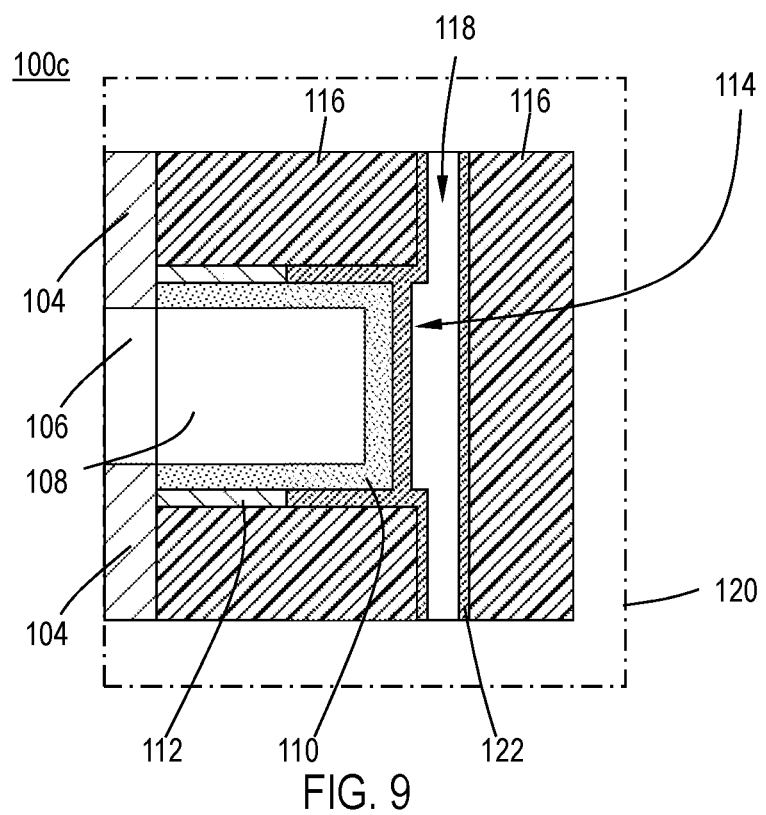
FIG. 9 illustrates an expanded cross-section view of a memory device according to one or more embodiments.

Referring to FIG. 9, which is an expanded view 100c of the area/square 120 in FIG. 7B, an oxide 122 is conformally deposited in the plurality of bit line openings 118 and deposited on an exposed surface of the dielectric material 116 and on the gate oxide layer 110. In one or more embodiments, the oxide 122 may comprise any suitable oxidic material known to one of skill in the art. In the illustrated embodiment, the oxide 122 is selectively deposited on the dielectric material relative to the gate oxide layer 110. In some embodiments, the oxide 122 is deposited on the gate oxide layer 110 and the dielectric material.

Figure 10:
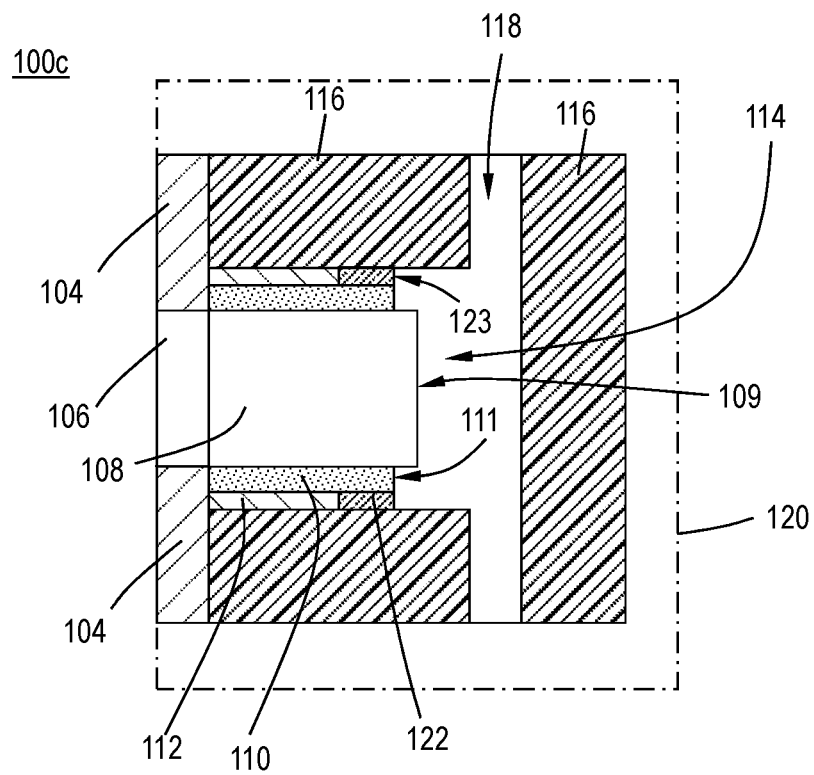
FIG. 10 illustrates an expanded cross-section view of a memory device according to one or more embodiments.

Referring to FIG. 10, which is an expanded view 100c of the area/square 120 in FIG. 7B, the oxide 122 is selectively removed such that only a portion of the oxide remains adjacent to the word line metal 112 and the gate oxide layer 110. When the oxide 122 is selectively removed, a portion of the gate oxide layer 110 on the pre-word line extension 108 is also removed, leaving a portion of the pre-word line extension 108 exposed in the bit line opening 118. The oxide 122 is selectively removed using any one of a number of methods known to one of skill in the art, including, but not limited to, chemical mechanical polishing (CMP), etching, or the like. In the illustrated embodiment, the oxide 122 and gate oxide layer 110 are removed so that the top surface 123 of the oxide 122 and the top surface 111 of the gate oxide layer 110 are recessed about the same amount below the top surface 109 of the pre-word line extension 108.

Figure 11:
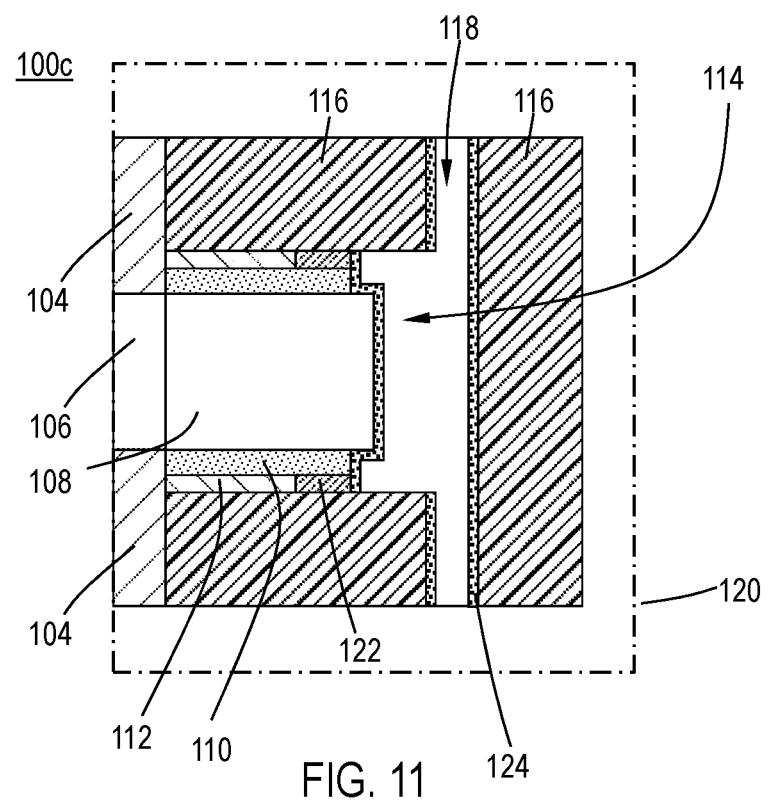
FIG. 11 illustrates an expanded cross-section view of a memory device according to one or more embodiments.
Figure 17:
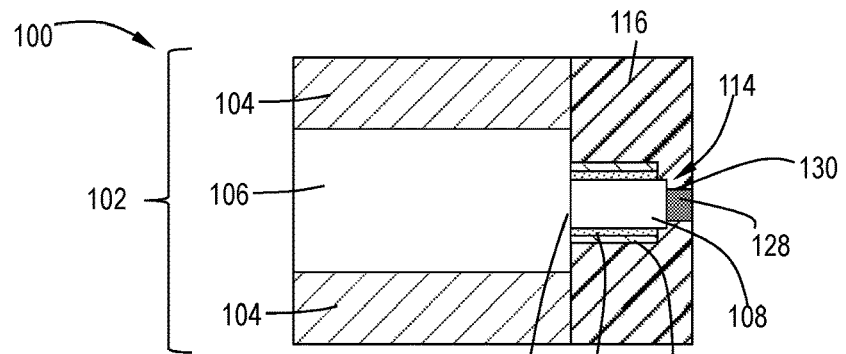
FIG. 17 illustrates a cross-section view of a memory device according to one or more embodiments.

Referring to FIG. 11, which is an expanded view 100c of the area/square 120 in FIG. 7B, a liner 124 is conformally deposited in the plurality of bit line openings 118 and deposited on an exposed surface of the dielectric material 116, the gate oxide layer 110, the pre-word line extension 108, and the oxide 122. The liner 124 can be deposited by any suitable technique known to the skilled artisan. The liner 124 can be any suitable material including, but not limited to, titanium nitride (TiN) or tantalum nitride (TaN).

Referring to FIG. 12, which is an expanded view 100c of the area/square 120 in FIG. 7B, a bit line metal 126 is deposited in the plurality of bit line openings 118 to form the bit line 128. In one or more embodiments, the bit line metal 126 comprises one or more of WSi, WN, or W. The bit line metal 126 can be deposited by any suitable technique known to the skilled artisan and can be any suitable material.

With reference to FIGS. 13A and 13B, the memory device 100 is illustrated with dielectric layers 104 removed for ease of visualization. FIG. 13B is a cross-section view 100d taken along axis B-B' of FIG. 13A. The stack 102 has at least one bit line 128 extending through the alternating dielectric layers (removed for ease of visualization) and memory layers 106. Each memory layer 104 has at least one word line 114 that comprises a pre-word line extension 108, a gate oxide layer 110 and a metal layer 112. The at least one word line 114 has a first side 130 adjacent the bit line 128 and a second side 132 opposite the first side 130.

Referring to FIGS. 14A and 14B, at least one pre-capacitor extension 134 is formed in the memory layer 106. FIG. 14B is a cross-section view 100d taken along axis B-B' of FIG. 14A. The pre-capacitor extension 134 is in contact with the second side 132 of the word line 114. In one or more embodiments, forming the at least one pre-capacitor extension 134 in the memory layer 106 comprises forming a mask layer (not illustrated) on the memory layer 106, and etching the memory layer 106 through the mask layer to form the pre-capacitor extension 134. In one or more embodiments, the method further comprises selectively removing a portion of the dielectric layers 104 (not illustrated for ease of visualization) and doping the pre-capacitor extension 134 to form a bottom electrode.

In FIG. 15, which is a cross-section view taken along axis B-B' of FIG. 14A, the at least one pre-capacitor extension 134 is formed into a capacitor 140 by first depositing a high-K dielectric 136 on the pre-capacitor extension 134. In one or more embodiments, the term "high-K dielectric" refers to a material with a high dielectric constant (as compared to, e.g. silicon dioxide). In one or more embodiments, the high-K dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), zinc oxide (ZnO), hafnium silicon oxide (HfSiO), or zirconium silicon oxide (ZrSiO).

In FIG. 16, which is a cross-section view taken along axis B-B' of FIG. 14A, the capacitor 140 is formed by first depositing a top contact 138 on the high-K dielectric 136 on the pre-capacitor extension 134. In one or more embodiments, the top contact 138 can be any suitable material known to the skilled artisan. In one or more embodiments, the top contact 138 is selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

With reference to FIGS. 17-23, in one or more alternative embodiments, a memory device 100 is formed having a plurality of bit lines 128 extending through a stack 102 of alternating memory layers 106 and dielectric layers 104. In one or more embodiments, each of the memory layers comprise at least one word line 114 having a first side 130 adjacent the plurality of bit lines 128 and a second side 132 opposite the first side. In one or more embodiments, the word line 114 comprises a pre-word line extension 108, a gate oxide layer 110 and a metal layer 112. In one or more embodiments, the gate oxide layer 110 comprises a gate oxide material. In one or more embodiments, the gate oxide layer 110 comprises one or more of silicon oxynitride (SiON), silicon oxide, or a high-K dielectric material. In one or more embodiments, the word line metal layer 112 comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). The word line metal 112 is deposited using any one of a number of methods known to one of skill in the art, including, but not limited to, chemical vapor deposition, physical vapor deposition, or atomic layer deposition.

Figure 18:
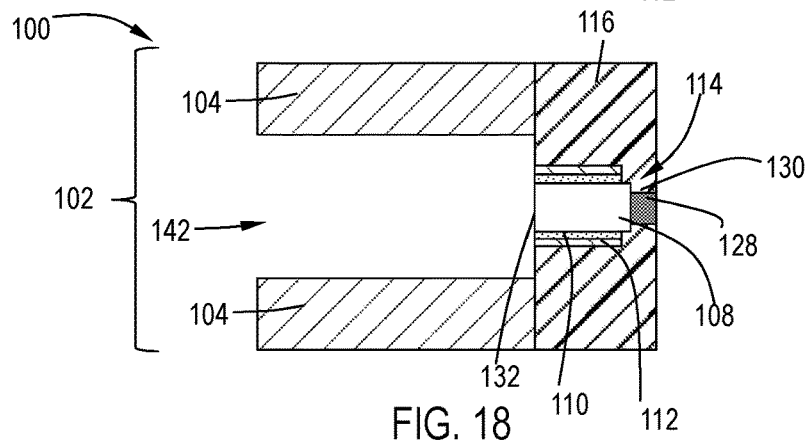
FIG. 18 illustrates a cross-section view of a memory device according to one or more embodiments.

Referring to FIG. 18, to form at least one capacitor in the memory layer, the memory layer 106 is removed. The memory layer 106 may be removed by any method known to one of skill in the art. When the memory layer 106 is removed, a pre-capacitor opening 142 is formed.

Figure 19:
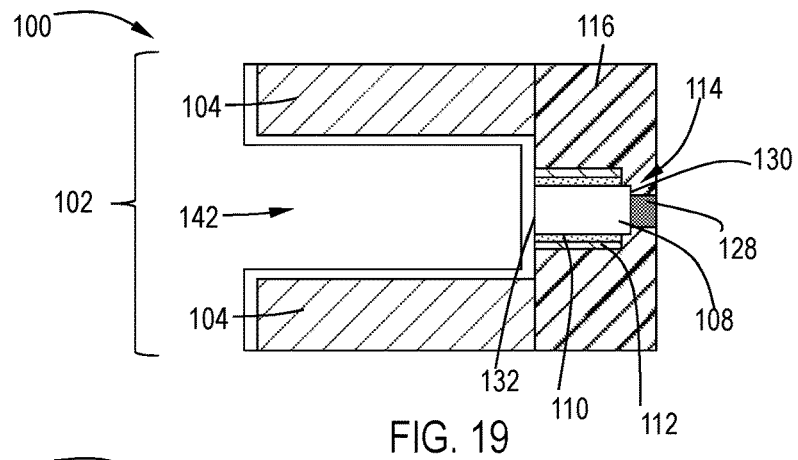
FIG. 19 illustrates a cross-section view of a memory device according to one or more embodiments.

With reference to FIG. 19, a metal electrode layer 144 is deposited in the pre-capacitor opening 142.

Figure 20:
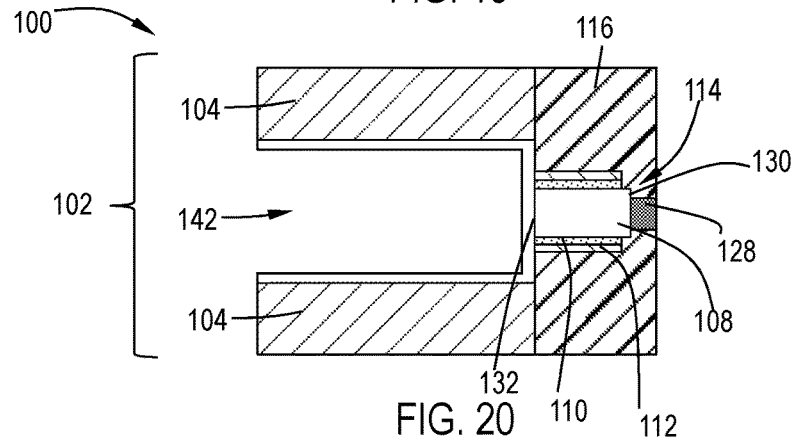
FIG. 20 illustrates a cross-section view of a memory device according to one or more embodiments.

Referring to FIG. 20, node separation is then performed.

Figure 21:
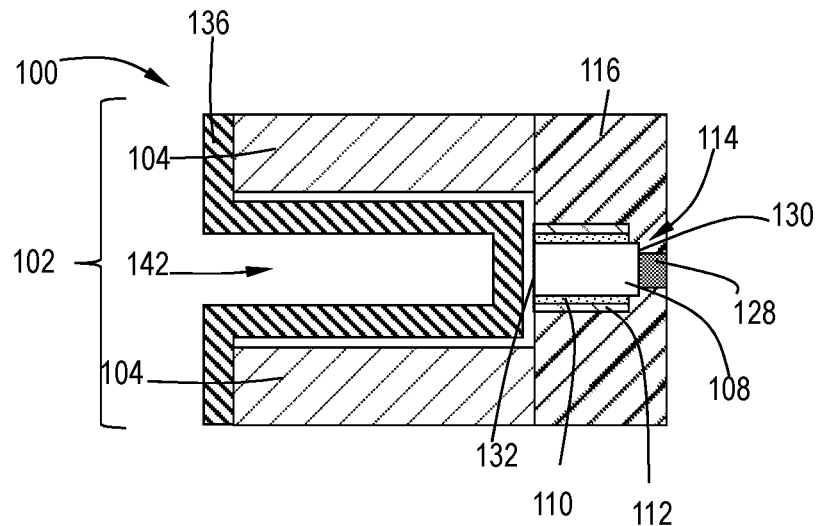
FIG. 21 illustrates a cross-section view of a memory device according to one or more embodiments.
Figure 22:
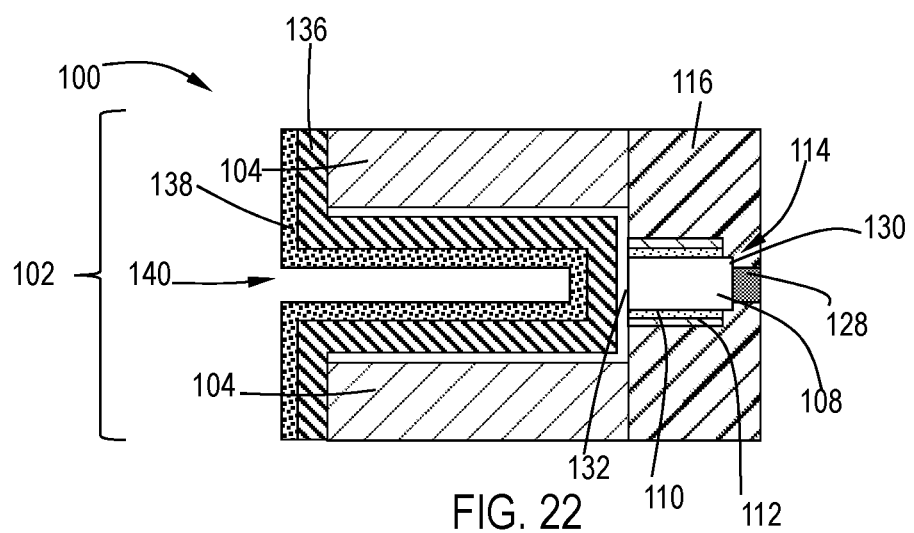
FIG. 22 illustrates a cross-section view of a memory device according to one or more embodiments.

In FIGS. 21 and 22, a high-K dielectric 136 is deposited through the pre-capacitor opening 142, followed by deposition of the top electrode 138 to form the capacitor 140.

Figure 23:
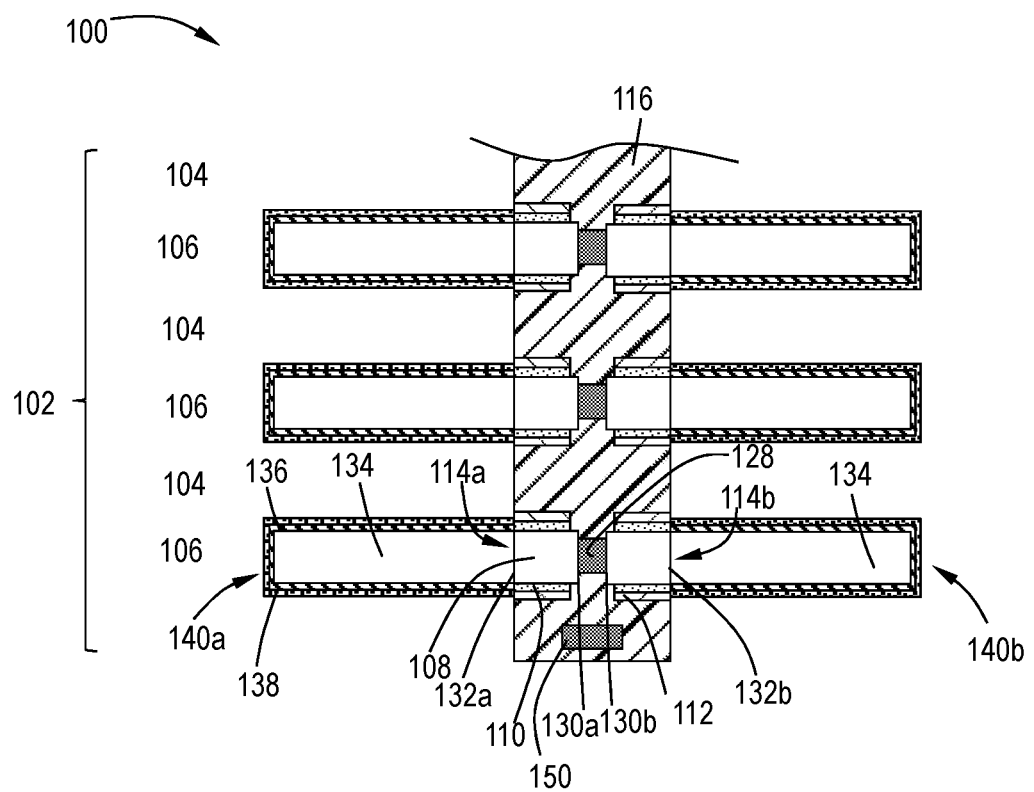
FIG. 23 illustrates a cross-section view of a memory device according to one or more embodiments.

Referring to FIG. 23, one or more embodiments provide a memory device 100 comprising a plurality of bit lines 128 extending through a stack 102 of alternating memory layers 106 and dielectric layers 104. In one or more embodiments, each of the memory layers 106 comprise a first word line 114a having a first side 130 adjacent a first side of the plurality of bit lines 128 and a second side 132 opposite the first side 130, a second word line 114b having a first side 130b adjacent a second side of the plurality of bit lines 128 and a second side 132b opposite the first side 130b, and at least one first capacitor 140 adjacent the second side 132a of the first word line 114a, and at least one second capacitor 140b adjacent the second side 132b of the second word line 114b. In one or more embodiments, the first word line 114a and the second word line 114b independently comprise a pre-word line extension 108, a gate oxide layer 110 and a metal layer 112. In one or more embodiments, the gate oxide layer 110 comprises a gate oxide material. In one or more embodiments, the gate oxide layer 110 comprises one or more of silicon oxynitride (SiON), silicon oxide, or a high-K dielectric material. In one or more embodiments, the word line metal layer 112 comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh). The word line metal 112 is deposited using any one of a number of methods known to one of skill in the art, including, but not limited to, chemical vapor deposition, physical vapor deposition, or atomic layer deposition.

In one or more embodiments, the plurality of bit lines 128 comprise one or more of WSi, WN, or W. In one or more embodiments, the at least one first capacitor 140a and the at least one second capacitor 140b independently comprise one or more of a high-κ dielectric or a metal layer comprising one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh).

In one or more embodiments, the first word line 114a and the second word line 114b independently comprise one or more of a gate oxide layer 136 or a top contact 138. In one or more embodiments, the gate oxide layer 136 comprises one or more of silicon oxynitride (SiON), silicon oxide (SiO), or a high-K dielectric material. In one or more embodiments, the top contact 138 comprises one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

In one or more embodiments, the memory device 100 comprises at least one first word line contact 150 in electrical communication with the first word line 114a and at least one second word line contact in electrical communication with the second word line 114b. In one or more embodiments, the at least one first word line contact and the at least one second word line contact extend through the alternating memory layers 106 and dielectric layers 104 a distance sufficient to terminate at one of the first word line 114a or second word line 114b, respectively.

One or more embodiments are directed to a method of forming a memory device 100. In one or more embodiments, the method comprises providing a stack 102 of alternating dielectric layers 104 and memory layers 106 with at least one bit line 128 extending through the alternating dielectric layers 104 and memory layers 106, each of the memory layers 106 having at least one word line 114 with a first side 130 adjacent the bit line 128 and a second side 132 opposite the first side 130. At least one pre-capacitor extension 134 is formed in the memory layer 106, the pre-capacitor extension 134 in contact with the second side 132 of the word line 114. In one or more embodiments, forming the at least one pre-capacitor extension 134 in the memory layer 106 comprises forming a mask layer (not illustrated) on the memory layer 106, and etching the memory layer 106 through the mask layer to form the pre-capacitor extension 134. A capacitor 140 is then formed on the pre-capacitor extension 134. In one or more embodiments, forming the capacitor 140 on the pre-capacitor extension 134 comprises depositing a high-k dielectric 136 on the pre-capacitor extension 134, and depositing a top electrode 138 on the high-k dielectric 136.

In one or more embodiments, the method further comprises selectively removing a portion of the dielectric layers 104 and doping the pre-capacitor extension 134 to form a bottom electrode (not illustrated).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a memory device, the method comprising:
    providing a stack of alternating dielectric layers and memory layers with at least one bit line extending through the alternating dielectric layers and memory layers, each of the memory layers having at least one word line with a first side adjacent the bit line and a second side opposite the first side;
    forming at least one pre-capacitor extension in the memory layer, the pre-capacitor extension in contact with the second side of the word line, wherein forming the at least one pre-capacitor extension in the memory layer comprises forming a mask layer on the memory layer, and etching the memory layer through the mask layer to form the pre-capacitor extension;
    selectively removing a portion of the dielectric layers and doping the pre-capacitor extension to form a bottom electrode; and
    forming a capacitor on the pre-capacitor extension.

2. The method of claim 1, wherein forming the capacitor on the pre-capacitor extension comprises depositing a high-k dielectric on the pre-capacitor extension, and depositing a top electrode on the high-k dielectric.

3. The method of claim 1, wherein the at least one bit line comprises one or more of WSi, WN, or W.

4. The method of claim 1, wherein the at least one word line comprises one or more of a gate oxide layer or a word line metal layer.

5. The method of claim 4, wherein the gate oxide layer comprises one or more of silicon oxynitride (SiON), silicon oxide (SiO), or a high-K dielectric material.

6. The method of claim 4, wherein the word line metal layer comprises one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh).

7. A method of forming a memory device, the method comprising:
    providing a stack of alternating dielectric layers and memory layers, each of the memory layers having a plurality pre-word line extensions;
    forming a first word line with a first side and a second side opposite the first side, by depositing a first word line metal on the plurality of pre-word line extensions to electrically connect the plurality of pre-word line extensions;
    patterning the alternating dielectric layers and memory layers to form a plurality of bit line openings, each bit line opening extending through the alternating dielectric layers and memory layers;
    depositing a bit line metal in the plurality of bit line openings to form a plurality of bit lines, each bit line having a first side and a second side opposite the first side, the first side adjacent the first side of the first word line;
    selectively removing a portion of the memory layer on the second side of the first word line adjacent the first side of the plurality of bit lines to form at least one first pre-capacitor extension; and
    depositing one or more of a high-κ dielectric material or a top electrode on the first pre-capacitor extension to form a first capacitor.

8. The method of claim 7, wherein the plurality of pre-word line extensions are formed by etching at least one channel through the stack of alternating dielectric layers and memory layers, and selectively removing the dielectric layers.

9. The method of claim 8, wherein the at least one channel is etched through an opening in a mask formed on the stack.

10. The method of claim 7, wherein forming the first word line further comprises forming an oxide layer on the pre-word line extension prior to depositing the first word line metal.

11. The method of claim 10, wherein forming the first word line further comprises forming a bit line metal seed layer on the oxide layer prior to depositing the bit line metal.

12. The method of claim 8, further comprising:
forming a second word line with a first side and a second side opposite the first side, by depositing a second word line metal on the plurality of pre-word line extensions on the second side of the plurality of bit lines;
selectively removing a portion of the memory layer on the second side of the second word line to form at least one second pre-capacitor extension; and
depositing one or more of a high-κ dielectric material or a second top electrode on the second pre-capacitor extension to form a second capacitor.

13. The method of claim 8, further comprising forming at least one first word line contact in electrical communication with the first word line and at least one second word line contact in electrical communication with the second word line.

14. The method of claim 13, wherein the at least one first word line contact and the at least one second word line contact extend through the alternating memory layers and dielectric layers a distance sufficient to terminate at one of the first word line or second word line, respectively.

15. The method of claim 7, wherein the plurality of bit lines comprise one or more of WSi, WN, or W.

16. The method of claim 12, wherein the first word line and the second word line independently comprise one or more of a gate oxide layer a first word line metal, or a second word line metal.

17. The method of claim 16, wherein the gate oxide layer comprises one or more of silicon oxynitride (SiON), silicon oxide (SiO), or a high-κ dielectric material.

18. The method of claim 16, wherein the first word line metal and the second word like metal independently comprise one or more of copper (Cu), cobalt (Co), tungsten (W), aluminum (Al), ruthenium (Ru), iridium (Ir), molybdenum (Mo), platinum (Pt), tantalum (Ta), titanium (Ti), or rhodium (Rh).

* * * * *